US007795907B1

(12) United States Patent
Wang

(10) Patent No.: US 7,795,907 B1
(45) Date of Patent: Sep. 14, 2010

(54) APPARATUS OF LOW POWER, AREA EFFICIENT FINFET CIRCUITS AND METHOD FOR IMPLEMENTING THE SAME

(76) Inventor: Michael C. Wang, 6 Redwood Tree La., Irvine, CA (US) 92612

( * ) Notice: Subject to any disclaimer, the term of this patent is extended or adjusted under 35 U.S.C. 154(b) by 0 days.

(21) Appl. No.: 12/577,156

(22) Filed: Oct. 10, 2009

(51) Int. Cl.
*H03K 19/23* (2006.01)
(52) U.S. Cl. .............................. 326/36; 326/35; 326/104
(58) Field of Classification Search .............. 326/35–36
See application file for complete search history.

(56) References Cited

U.S. PATENT DOCUMENTS 7,592,841 B2 * 9/2009 Kapoor ........................ 326/121
2010/0026346 A1 * 2/2010 Chiang et al. ................ 326/122

OTHER PUBLICATIONS

A. Carlson, Z. Guo, S. Balasubramanian, L.T. Pang, T.J. King Liu and B. Nikolic, "FinFET SRAM with Enhanced Read / Write Margins," SOI Conference, 2006.

A. Muttreja, N. Agarwal and N. K. Jha, "CMOS logic design with independent-gate FinFETs", ICCD 25th International Conference on, 2007, pp. 560-567.

V. Bertacco, "Decision Diagrams and Pass Transistor Logic Synthesis", Proc. of the ACM/IEEE International Workshop on Logic Synthesis, May 1997, pp. 1-5.

K. Bernstein, C. T. Chuang, R. Joshi and R. Puri, "Design and CAD challenges in sub-90 nm CMOS technologies", ICCAD, Nov. 2003, pp. 129-136.

S. A. Tawfik and V. Kursun, "FinFET domino logic with independent gate keepers", Microelectronics Journal, Mar. 2009.

* cited by examiner

*Primary Examiner*—Anh Q Tran

(57) ABSTRACT

A novel implementation of a majority gate and a 2-1 MUX by using both gates of FinFET transistors as inputs is presented. A general methodology of using both gates of FinFET as inputs to implement any digital logic circuit is also presented. Circuits implemented using this methodology have significant advantages over CMOS logic counterpart and pass transistor logic counterpart in terms of power consumption and cell area.

9 Claims, 9 Drawing Sheets

US 7,795,907 B1

APPARATUS OF LOW POWER, AREA EFFICIENT FINFET CIRCUITS AND METHOD FOR IMPLEMENTING THE SAME

FIELD OF THE INVENTION

The present invention relates to a method of implementing low power, area efficient FinFET circuits. In particular, implementation of a majority gate and a 2-1 MUX using this method is provided.

BACKGROUND

As the size of transistors has scaled down, so have many digital applications. Cell phones, laptops, sensors, and many other applications all shrunk in size over the last few decades and they are more and more portable. For this to happen, chips in these digital applications have to be designed to optimize the number of transistors used, the fewer the better. In this case, pass transistor logic is an attractive solution because a circuit can usually be implemented in pass transistor logics with around half of the number of transistors required for static CMOS implementation. However, pass transistor logic allows inputs to be tied to the source and the drain of a transistor, thus create possible situations where NMOS has to drive a logic 1 and PMOS has to drive a logic 0. Since NMOS is not a good pull-up device, the output of a pass transistor circuit will suffer from a voltage drop $V_{th}$ and never achieve a full voltage swing to $V_{DD}$. With the continuing scaling of supply voltage, this voltage drop cannot be tolerated.

FinFET is a double-gate field effect transistor (DGFET). By having two gates that can be independently controlled, FinFET is more versatile than traditional single-gate field effect transistors. The additional back gate of a FinFET gives circuit designers many options. The back gate can serve as a secondary gate that enhances the performances of the front (primary) gate. For example, if the front gate voltage is $V_{DD}$ (transistor is ON) the back gate can be biased to $V_{DD}$ to provide bigger current drive, which reduces transistor delay. If the front gate voltage is 0 (transistor is OFF), the back gate can be biased to 0, which raises the threshold voltage of the front gate and reduces the leakage current. Most recent FinFET circuit researches, such as FinFET SRAM (See A. Carlson, Z. Guo, S. Balasubramanian, L. T. Pang, T. J. King Liu, and B. Nikolic, "FinFET SRAM with Enhanced Read/Write Margins", SOI Conference, 2006), focus on utilizing the back gate to improve circuit performance. On the other hand, the back gate can also be used to reduce the number of transistors needed to implement many logic functions. For an N-type FinFET (N-FinFET), the transistor turns on if either the front gate or the back gate is $V_{DD}$—this is equivalent to two NMOS transistors in parallel. Recent researches, such as a three-transistor FinFET NAND gate (A. Muttreja, N. Agarwal, N. K. Jha, "CMOS logic design with independent-gate FinFETs", ICCD 25th International Conference, 2007, pp. 560-567), utilize this property. However, to our understanding, no research utilizes this property beyond a simple logic gate such as a NAND gate.

SUMMARY

A new method to design low power, area efficient FinFET-based circuits (both gates of FinFET are used as inputs) is provided. Exemplary implementations of a majority gate and a 2-1 MUX are also provided.

A method for implementing FinFET-based circuits is also provided. Unlike traditional CMOS-based circuit implementation methodology, which is derived from AND-OR logic expression, or pass transistor-based circuit implementation methodology, which is derived from Binary Decision Diagram, FinFET-based circuit implementation methodology is derived from OR-AND logic expression and utilizes the fact that a FinFET is equivalent to two MOSFETs in parallel from digital logic perspective.

In addition, an exemplary majority gate implementation with six FinFETs is provided. Both gates of each one of the six FinFETs are independently controlled by inputs. This implementation of a majority gate provides significant area and power reduction.

In addition, an exemplary 2-1 MUX implementation with four FinFETs is provided. Both gates of each one of the four FinFETs are independently controlled by inputs. This implementation of a 2-1 MUX provides significant area and power reduction.

Simulation results show that compared to other logic implementations, FinFET logic circuits achieve significant area and power reduction without voltage or transistor scaling. A potential drawback may occur in the slowdown of circuit speed.

In order to facilitate an understanding of the invention, the preferred embodiments are illustrated in the drawings, and a detailed description thereof follows. It is not intended, however, that the invention be limited to the particular embodiments described or to use in connection with the apparatus illustrated herein.

DETAILED DESCRIPTION

A majority gate is commonly used in a full adder. A typical majority gate has three inputs and one output. If more than half of the inputs are "1", it returns a "1" on the output; otherwise it returns a "0". Table 1 shows the truth table of a 3-input majority gate

TABLE 1

Truth table of a 3-input majority gate

| A | B | C | Out |
|---|---|---|-----|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Figure 1:
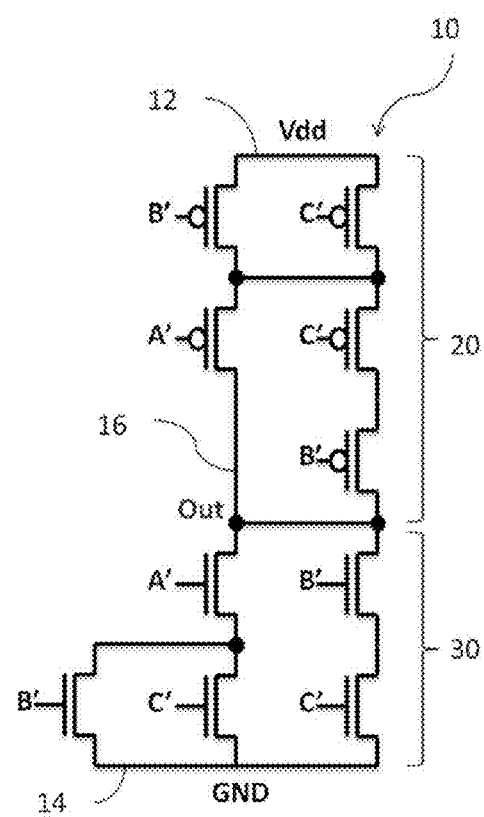
FIG. 1 shows a schematic diagram of CMOS implementation of a majority gate.
Figure 2:
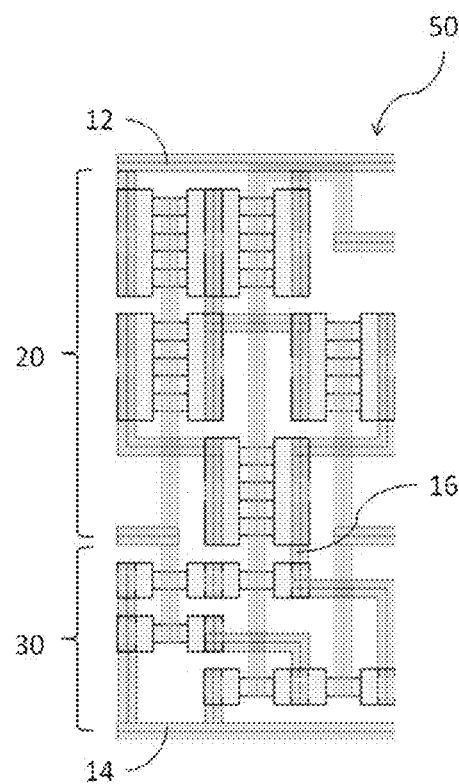
FIG. 2 shows a layout in 30 nm technology of CMOS implementation of the majority gate of FIG. 1.

FIG. 1 shows a schematic of a CMOS implementation 10 of the majority gate. In this circuit, the output 16 may be coupled to either $V_{DD}$ 12 or GND 14 through the pull-up network 20 or the pull-down network 30 so that it is never floating. Since NMOS are good at passing "0" while PMOS are good at passing "1", NMOS transistors are used in the pull-down network 30 while PMOS transistors are used in the pull-up network 20. FIG. 2 shows a layout 50 of the schematic 10 shown in FIG. 1.

Figure 3:
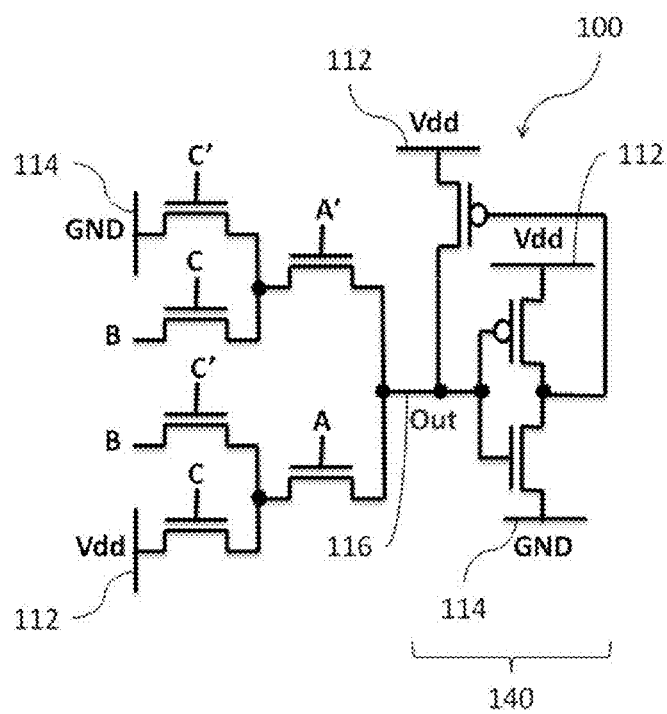
FIG. 3 shows a schematic diagram of a pass transistor implementation of a majority gate having the same function as the majority gate of FIG. 1.
Figure 4:
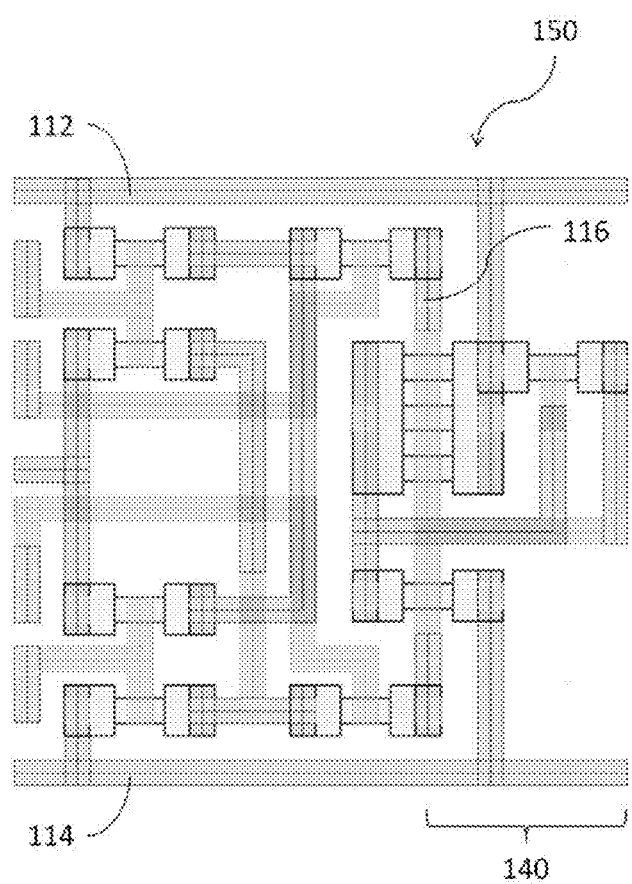
FIG. 4 shows a layout in 30 nm technology of pass transistor implementation of the majority gate of FIG. 3.

FIG. 3 shows a schematic of a pass transistor implementation 100 of the majority gate having equivalent function as the majority gate of FIG. 1. Pass transistor implementation of a circuit can be designed by first generating a binary decision diagram, and then mapping nodes to transistors and branches to wires (See V. Bertacco, "Decision Diagrams and Pass Transistor Logic Synthesis," Proc. of the ACM/IEEE International Workshop on Logic Synthesis, May 1997, pp. 1-5). In the pass transistor implementation of a circuit, a transistor can pass "0" and "1". In other words, it "does more work" than a transistor in CMOS implementation of a circuit that only passes either "0" (NMOS) or "1" (PMOS). The number of transistors required in pass transistor implementation is generally less than that of a CMOS implementation of the same function. Pass transistor implementation of a circuit does not achieve full voltage swing at the output node because transistors have to pass both "0" and "1", and as mentioned earlier, each type of transistor is only good at passing either "0" or "1". To restore output voltage, a three-transistor level restorer circuit 140 is appended at the output node 116. FIG. 4 shows a layout 150 of the schematic 100 shown in FIG. 3.

Both CMOS implementation and pass transistor implementation were developed for conventional MOSFET. If FinFET technology is available, we can easily adapt both circuit design methodologies by replacing NMOS with N-FinFET and PMOS with P-FinFET, then, tie both gates of FinFET together. By using this approach, we can design a FinFET version of CMOS implementation or pass transistor implementation of a circuit that retains the same functionalities as the MOSFET version, while provides better circuit performances and reduces leakage current through effective suppression of short-channel effect and near-ideal subthreshold swing. For this reason, we will use FinFET for all layout designs and simulations. This way, we will be able to show that the impacts of using different logic styles come from the difference in architecture, not from the difference in transistors used.

Figure 5:
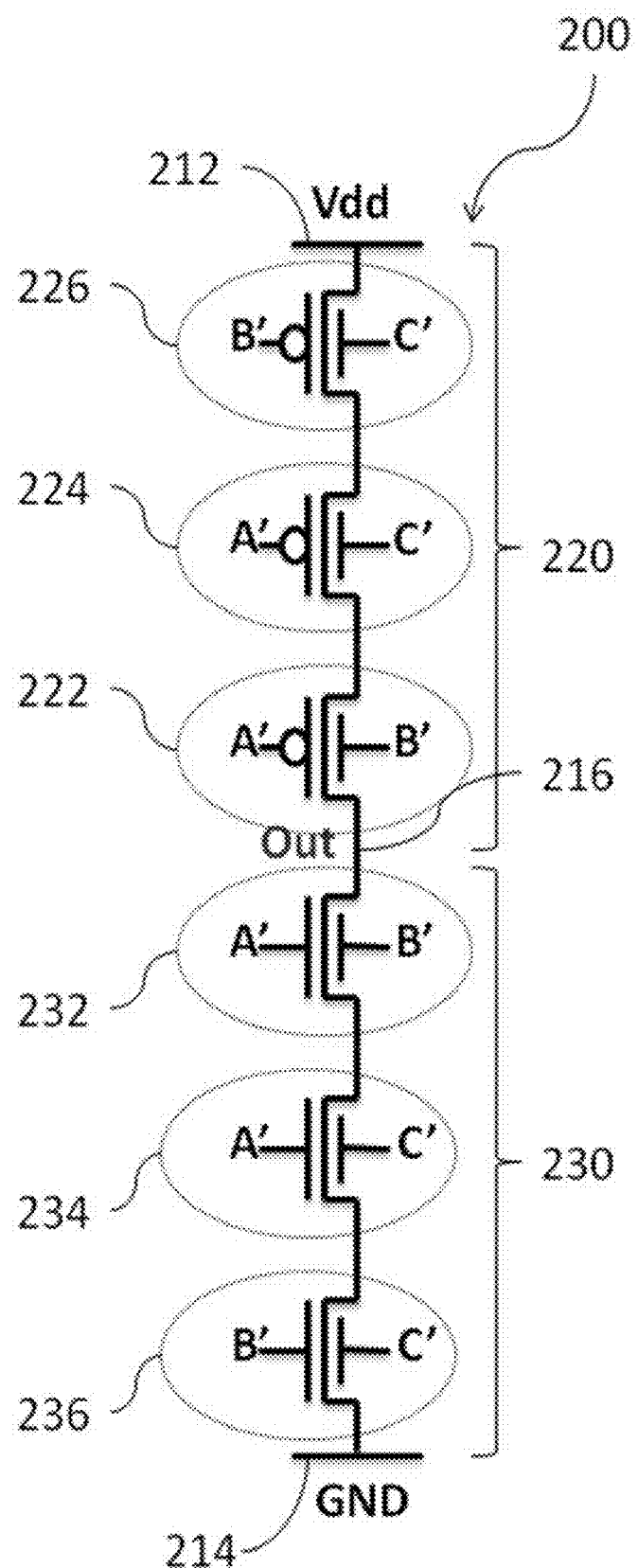
FIG. 5 shows a schematic diagram of FinFET implementation of a majority gate having the same function as the majority gate of FIG. 1 and FIG. 3.
Figure 6:
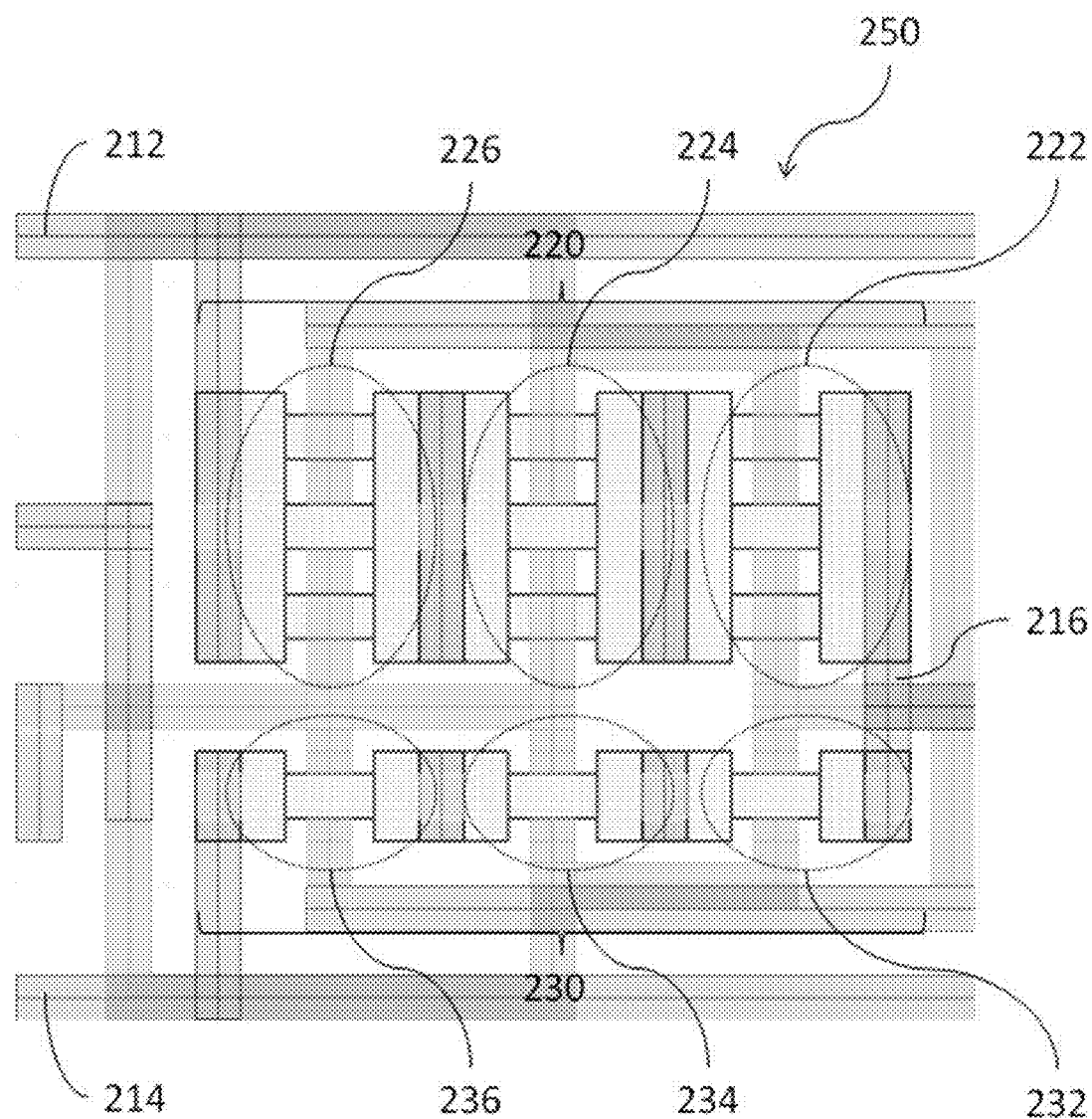
FIG. 6 shows a layout in 30 nm technology of FinFET implementation of the majority gate of FIG. 5.

FIG. 5 shows a schematic of a FinFET implementation 200 of the majority gate having the same function as the majority gate implementation of FIG. 1 and FIG. 3. This implementation 200 uses only six transistors. Similar to the CMOS implementation 10, FinFET implementation 200 also consists of a pull-up network 220, which passes "1", and a pull-down network 230, which passes "0". Notice that each FinFET in FIG. 5 is driven by different inputs. This is called "independent mode" of FinFET. From logic perspective, a FinFET operating in "independent mode" is equivalent to two MOSFETs operating in parallel. FIG. 6 shows a layout 250 of the schematic 200 shown in FIG. 5.

The pull-up network 220 is constructed by writing the output Out 216 in OR-AND logic form (in contrast with the more intuitive AND-OR logic form): Out=(A+B)*(A+C)*(B+C). The pull-up network 220 is constructed by putting three smaller networks in series: (A+B) 222, (A+C) 224, and (B+C) 226. Each of these smaller networks 222, 224, and 226 can be constructed by putting two PMOS transistors in parallel, and couple the gates of both PMOS transistors to complement inputs. For example, the network (A+B) 222 is constructed by putting two PMOS transistors in parallel, one PMOS is coupled to input A' and the other PMOS is coupled to input B'. Since FinFET is equivalent to two MOSFET in parallel, the network (A+B) 222 can be represented by a single P-FinFET whose front gate is coupled to input A' and whose back gate is coupled to input B' (or vice versa). Networks (A+C) 224 and (B+C) 226 can be constructed similarly.

The pull-down network 230 is constructed by writing the output Out 216 in OR-AND logic form (in contrast with the more intuitive AND-OR logic form): Out'=(A'+B')*(A'+C')*(B'+C'). The pull-down network 230 is constructed by putting three smaller networks in series: (A'+B') 232, (A'+C') 234, and (B'+C') 236. Each of these smaller networks 232, 234, and 236 can be constructed by putting two NMOS transistors in parallel, and couple the gates of both NMOS transistors to inputs. For example, the network (A'+B') 232 is constructed by putting two NMOS transistors in parallel, one NMOS is coupled to input A' and the other NMOS is coupled to input B'. Since FinFET is equivalent to two MOSFET in parallel, the network (A+B) 222 can be represented by a single N-FinFET whose front gate is coupled to input A' and whose back gate is coupled to input B' (or vice versa). Networks (A'+C') 234 and (B'+C') 236 can be constructed similarly.

Figure 7:
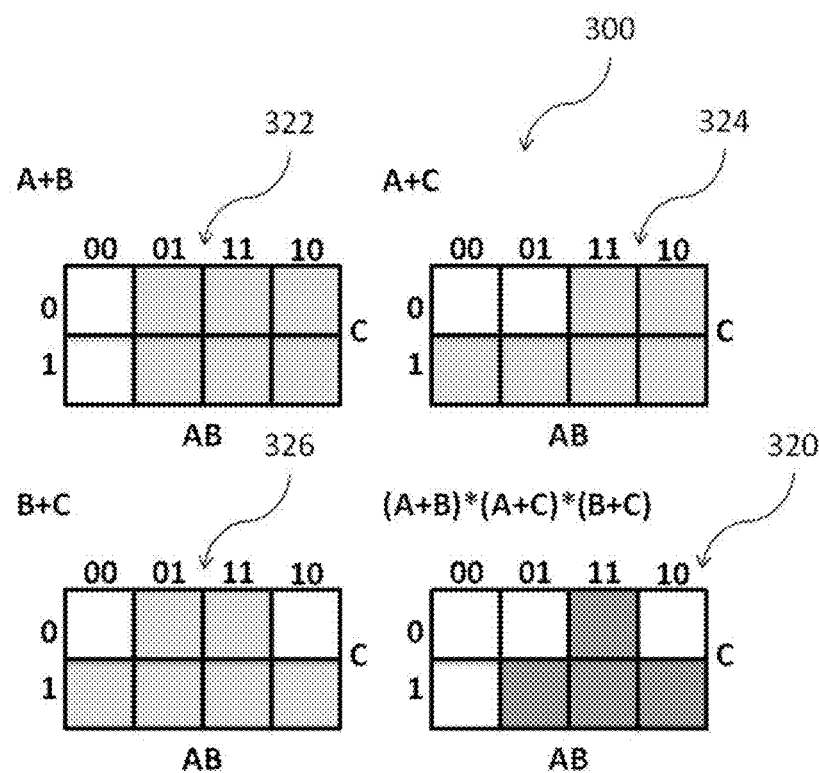
FIG. 7 shows Karnaugh maps used to construct the pull-up network of FinFET implementation of the majority gate of FIG. 5.

FIG. 7 shows Karnaugh maps used to construct the pull-up network 220 of FinFET implementation of the majority gate shown in FIG. 5. The networks (A+B) 222, (A+C) 224, and (B+C) 226 are represented by Karnaugh maps 322, 324, and 326, respectively. The pull-up network 220 is presented by Karnaugh map 320.

Figure 8:
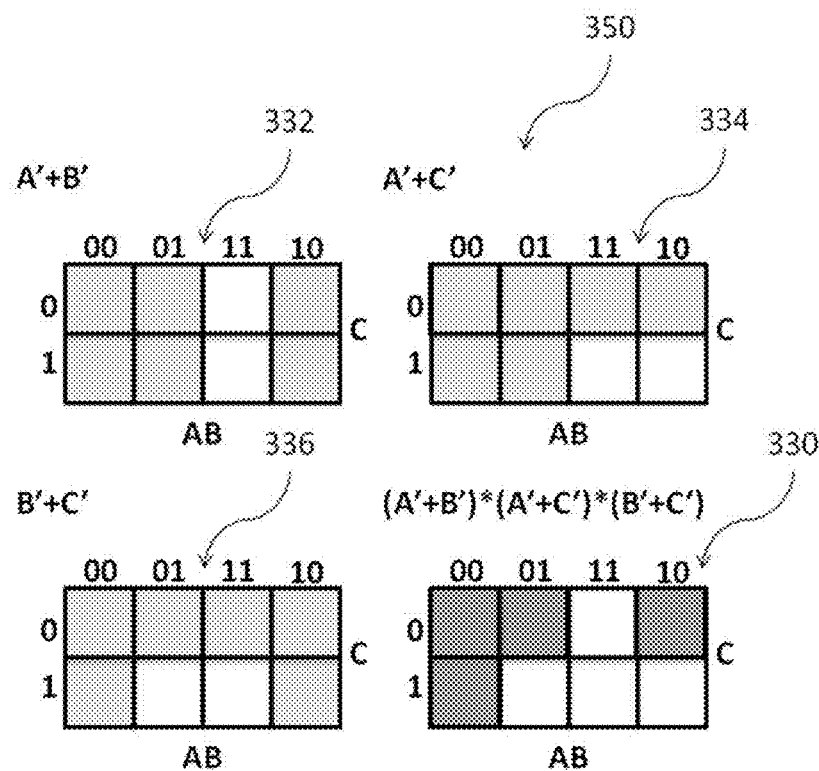
FIG. 8 shows Karnaugh maps used to construct the pull-down network of FinFET implementation of the majority gate of FIG. 5.

FIG. 8 shows Karnaugh maps used to construct the pull-down network 230 of FinFET implementation of the majority gate. The networks (A'+B') 232, (A'+C') 234, and (B'+C') 236 are represented by Karnaugh maps 332, 334, and 336, respectively. The pull-down network 230 is presented by Karnaugh map 330.

A 2-1 MUX is another widely used 3-input function. It has applications in both combination logic circuit and sequential logic circuit. Table 2 shows the truth table of the 2-1 MUX function. A, B are the primary input bits, S is the select bit. The output bit is equal to A if S=0, and B if S=1. In other words, the output function is Out=S'*A+S*B, where S' is the complement of S.

TABLE 2

Truth table of a 2-1 MUX

| A | B | S | Out |
|---|---|---|-----|
| 0 | 0 | 0 | 0 |
| 0 | 0 | 1 | 0 |
| 0 | 1 | 0 | 0 |
| 0 | 1 | 1 | 1 |
| 1 | 0 | 0 | 1 |
| 1 | 0 | 1 | 0 |
| 1 | 1 | 0 | 1 |
| 1 | 1 | 1 | 1 |

Figure 9:
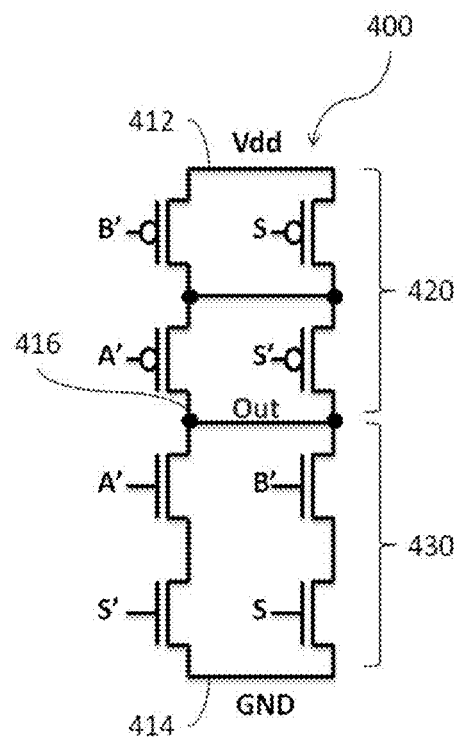
FIG. 9 shows a schematic diagram of CMOS implementation of a 2-1 MUX.
Figure 10:
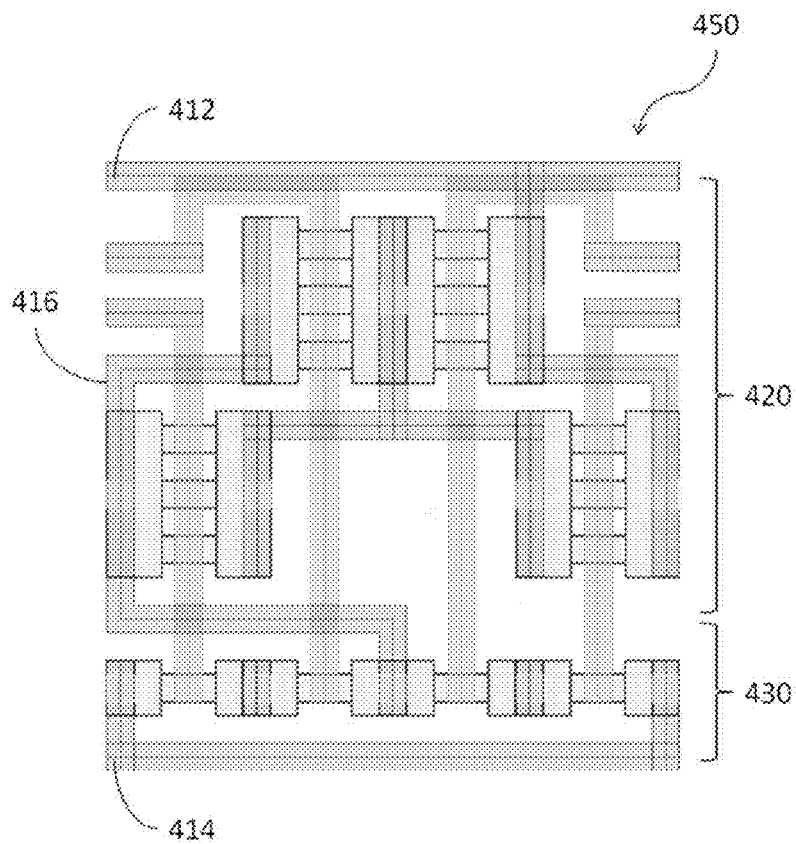
FIG. 10 shows a layout in 30 nm technology of CMOS implementation of the 2-1 MUX of FIG. 9

FIG. 9 shows a schematic of a CMOS implementation 400 of the 2-1 MUX. In this circuit, the output is coupled to either $V_{DD}$ 412 or GND 414 through the pull-up network 420 or the pull-down network 430. FIG. 10 shows a layout 450 of the schematic 400 of FIG. 9.

Figure 11:
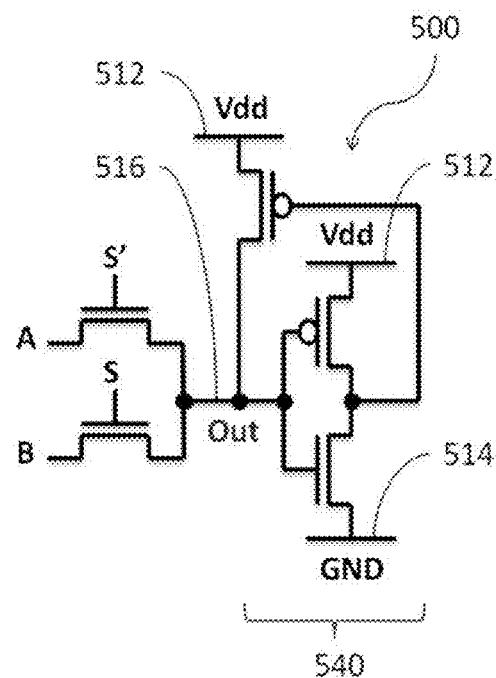
FIG. 11 shows a schematic diagram of a pass transistor implementation of a 2-1 MUX having the same function as the 2-1 MUX of FIG. 9.
Figure 12:
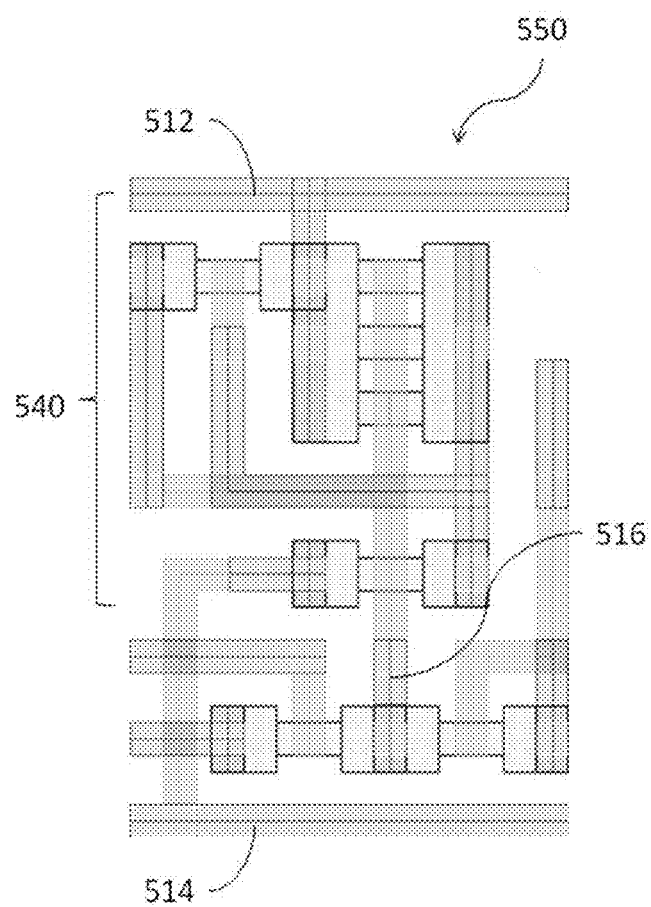
FIG. 12 shows a layout in 30 nm technology of pass transistor implementation of the 2-1 MUX of FIG. 11.

FIG. 11 shows a schematic of a pass transistor implementation 500 of the 2-1 MUX. A three-transistor level restorer circuit 540 is appended at the output node 516. FIG. 12 shows a layout 550 of the schematic 500 shown in FIG. 11.

Figure 13:
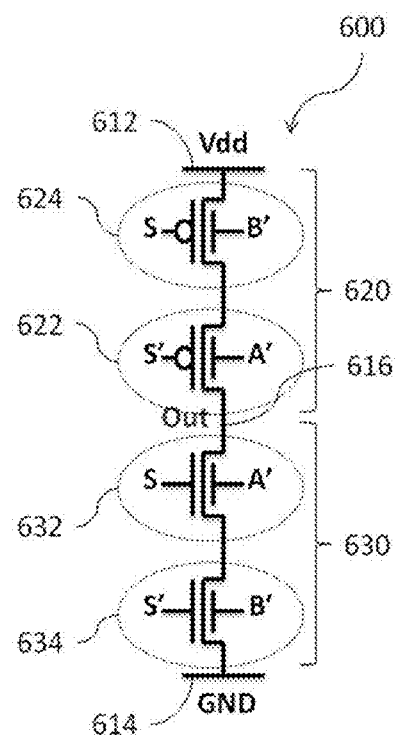
FIG. 13 shows a schematic diagram of FinFET implementation of a 2-1 MUX having the same function as the 2-1 MUX of FIG. 9 and FIG. 11.
Figure 14:
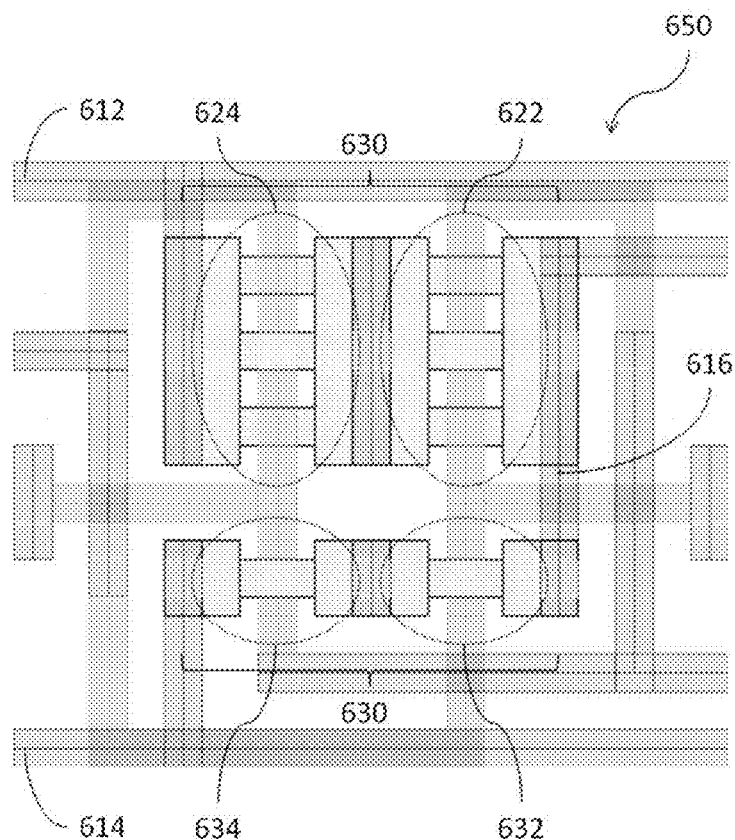
FIG. 14 shows a layout in 30 nm technology of FinFET implementation of the 2-1 MUX of FIG. 13.

FIG. 13 shows a schematic of a FinFET implementation 600 of the 2-1 MUX. This implementation 600 uses only four transistors. Similar to CMOS implementation, FinFET implementation also consists of a pull-up network 620, which passes "1", and a pull-down network 630, which passes "0. FIG. 14 shows a layout 650 of the schematic 600 shown in FIG. 13.

The pull-up network 620 is constructed by writing the output Out 616 in OR-AND logic form (in contrast with the more intuitive AND-OR logic form): Out=(S+A)*(S'+B). The pull-up network 620 is constructed by putting two smaller networks in series: (S+A) 622, and (S'+B) 624. Each of these smaller networks 622 and 624 can be constructed by putting two PMOS transistors in parallel, and couple the gates of both PMOS transistors to complement inputs. For example, the network (S+A) 622 is constructed by putting two PMOS transistors in parallel, one PMOS is coupled to input S' and the other PMOS is coupled to input A'. Since FinFET is equivalent to two MOSFET in parallel, the network (S+A) 622 can be represented by a single P-FinFET whose front gate is coupled to input S' and whose back gate is coupled to input A' (or vice versa). Networks (S'+B) 624 can be constructed similarly.

The pull-down network 630 is constructed by writing the output Out 616 in OR-AND logic form (in contrast with the more intuitive AND-OR logic form): Out'=(S+A')*(S'+B'). The pull-down network 630 is constructed by putting two smaller networks in series: (S+A') 632 and (S'+B') 634. Each of these smaller networks 632 and 634 can be constructed by putting two NMOS transistors in parallel, and couple the gates of both NMOS transistors to inputs. For example, the network (S+A') 232 is constructed by putting two NMOS transistors in parallel, one NMOS is coupled to input S and the other NMOS is coupled to input A'. Since FinFET is equivalent to two MOSFET in parallel, the network (A+B) 222 can be represented by a single N-FinFET whose front gate is coupled to input S and whose back gate is coupled to input A' (or vice versa). Networks (S'+B') 634 can be constructed similarly.

Figure 15:
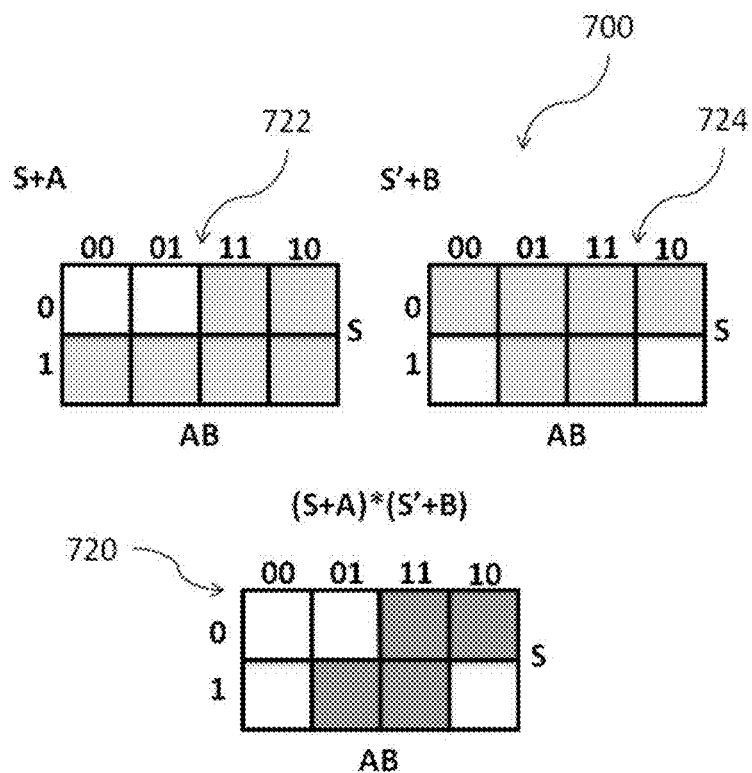
FIG. 15 shows Karnaugh maps used to construct the pull-up network of FinFET implementation of the 2-1 MUX of FIG. 13.

FIG. 15 shows Karnaugh maps used to construct the pull-up network 620 of FinFET implementation 600 of the 2-1 MUX shown in FIG. 13. The networks (S+A) 622 and (S'+B) 624 are represented by Karnaugh maps 722 and 724, respectively. The pull-up network 620 is presented by Karnaugh map 720.

Figure 16:
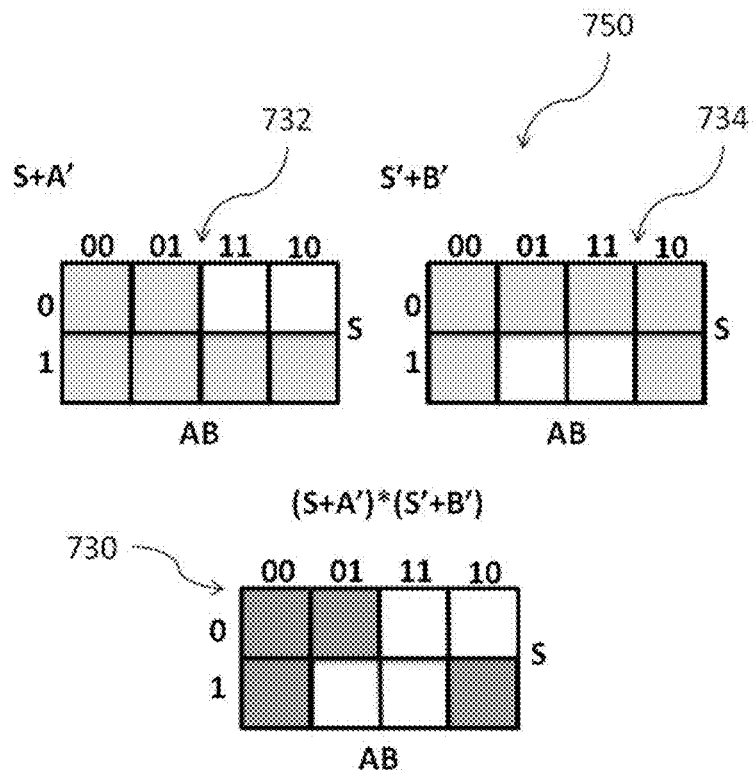
FIG. 16 shows Karnaugh maps used to construct the pull-down network of FinFET implementation of the 2-1 MUX of FIG. 13.

FIG. 16 shows Karnaugh maps used to construct the pull-down network 630 of FinFET implementation 600 of the 2-1 MUX shown in FIG. 13. The networks (S+A') 632 and (S'+B') 634 are represented by Karnaugh maps 732 and 734, respectively. The pull-down network 630 is presented by Karnaugh map 730.

In view of the foregoing, a general process for implementing FinFET circuits can be derived from the examples of the majority gate and the 2-1 MUX designs. The general process for implementing FinFET circuits may comprise the steps described hereafter.

First, construct OR-AND logic expression for the output (pull-up network) and construct OR-AND logic expression for the complement of the output (pull-down network).

Then, map the logic expression to transistors using the traditional CMOS implementation algorithm.

Then, find two parallel NMOS transistors with gate coupled to input X, Y, respectively, and replace them with one N-FinFET with front gate coupled to input X and back gate coupled to input Y. Alternatively, find two parallel NMOS transistors with gate coupled to input X, Y, respectively, and replace them with one N-FinFET with front gate coupled to input Y and back gate coupled to input X.

Then, find two parallel PMOS transistors with gate coupled to input X, Y, respectively, and replace them with one P-FinFET with front gate coupled to input X and back gate coupled to input Y. Alternatively, find two parallel PMOS transistors with gate coupled to input X, Y, respectively, and replace them with one P-FinFET with front gate coupled to input Y and back gate coupled to input X.

Then, find all the unpaired NMOS transistors left with gate coupled to input Z and replace them with one N-FinFET with both front and back gates coupled to input Z.

Finally, find all the unpaired PMOS transistors left with gate coupled to input Z and replace them with one P-FinFET with both front and back gates coupled to input Z.

The orders for replacing MOSFETs with FinFETs with appropriate inputs are interchangeable.

Simulation results generated by Synopsys Sentaurus are presented in Tables 3 and 4. The extraction of three important metrics: area, power, and delays will be described hereafter.

TABLE 3

Summary of majority gate implementations

| | Designs | | |
|---|---|---|---|
| | CMOS | PTL | FinFET |
| # Transistor | 10 | 9 | 6 |
| Area (nm$^2$) | 475200 | 529200 | 348300 |
| F. Time (ps) | 10.913 | 31.227 | 24.270 |
| R. Time (ps) | 14.204 | 31.883 | 70.314 |
| Power (uW) | 44.7 | 57.5 | 28.0 |

TABLE 4

Summary of 2-1 MUX function implementations

| | Designs | | |
|---|---|---|---|
| | CMOS | PTL | FinFET |
| # Transistor | 8 | 5 | 4 |
| Area (nm$^2$) | 415800 | 243000 | 273600 |
| F. Time (ps) | 15.249 | 20.148 | 28.132 |
| R. Time (ps) | 9.079 | 28.604 | 49.769 |
| Power (uW) | 31.5 | 41.4 | 22.0 |

In FinFET technology, "device widths are dispensed in units of whole fins only." (See K. Bernstein, C. T. Chuang, R. Joshi and R. Puri, "Design and CAD challenges in sub-90 nm CMOS technologies," ICCAD, November 2003, pp. 129-136). This is known as device width quantization, which limits the ability to size transistors effectively in FinFET circuit. On top of that, there is also problem with FinFETs with even number of fins operating in "independent mode," because of the difficulty in routing inputs. However, it is shown that both inputs can be easily routed in a FinFET with three fins (See S. A. Tawfik and V. Kursun, "FinFET domino logic with independent gate keepers," Microelectronics Journal, March 2009). For this reason, P-FinFETs are allotted three fins while N-FinFETs are allotted one fin. As shown in Tables 3 and 4, FinFET logic implementation achieves on average 25% reduction in cell area.

Delay is measured as the time difference between 10% and 90% of the voltage swing. For example, if we are trying to bring node A from 0V to 1V, then the delay is the time it takes for node A to go from 0.1V to 0.9V. In our simulation, we assumed that all the intermediate nodes have 1 fF capacitance while the output nodes and input buses have 5 fF capacitance.

Simulation results show that CMOS logic circuits are approximately 2.2 times faster than pass transistor logic circuit and 3.5 times faster than FinFET logic circuit.

The dynamic power consumption on output node and input buses will not be considered because each circuit implementation switches same number of times at these nodes. The sole exception is pass transistor logic implementation for majority gate, which has 5 inputs (A, A', B, C, C') compare with 3 inputs (A', B', C') of the other two circuit implementations. The extra inputs lead to more dynamic power consumption for pass transistor logic implementation, but since it already has the highest active and leakage power consumption, omitting dynamic power consumption calculation will not change the fact that pass transistor logic circuits are usually inferior in term of power consumption.

Active power is the power consumed when both pull-up and pull-down network are active, creating a direct current path from $V_{DD}$ to ground, while leakage power is the power consumed when charges "leak" through a transistor that is off. Calculating the active and leakage components of power consumption separately is very difficult. Therefore, we will calculate the aggregated power consumption by first calculating instantaneous power $P(t)=V(t)*I(t)$, then sum up P(t) for all times (in our simulation, t: 0~1000 ps), which will give us the total energy consumed for this operation. This is easy to do since Sentaurus can provide information about voltage and current across each transistor at any time. Finally, sum up the energy consumption for all transistors and divide by clock period to obtain the active and leakage power consumption, which is listed in Table 3 for majority gate and Table 4 for 2-1 MUX function.

Note that the input sequence in our simulation implies that input C (for majority gate) or input S (for 2-1 MUX) switches most frequently, while input A switches least frequently. The placement of inputs in a circuit has some impacts on power consumption. For consistency, we place the least frequent switching input closest to the output and most frequent switching input closest to supply rails.

Simulation results show that FinFET logic circuits consume least amount of power. In comparison, CMOS logic circuits consume about 52% more power and pass transistor logic circuits consume about 98% more power.

The processes described herein for implementing FinFET circuits are applicable to any type of processing application and (without limitation) are particularly well suited for computer-aided design (CAD) applications. The processes described herein may be implemented in hardware circuitry, in computer software, or a combination of hardware circuitry and computer software and is not limited to a particular hardware or software implementation.

A computer system upon which the above-described embodiments may be implemented is described below. The computer system may include a bus or other communication mechanism for communicating information, and a processor coupled with bus for processing information. The computer system may also include a main memory, such as a random access memory (RAM) or other dynamic storage device, coupled to bus for storing information and instructions to be executed by processor. Main memory also may be used for storing temporary variables or other intermediate information during execution of instructions to be executed by processor. The computer system may further include a read only memory (ROM) or other static storage device coupled to bus for storing static information and instructions for processor. A storage device, such as a magnetic disk or optical disk, is provided and coupled to bus for storing information and instructions.

The computer system may be coupled via bus to a display, such as a liquid crystal display (LCD), for displaying information to a computer user. An input device, including alpha-numeric and other keys, is coupled to bus for communicating information and command selections to processor. Another type of user input device is cursor control, such as a mouse, a trackball, or cursor direction keys for communication of direction information and command selections to processor and for controlling cursor movement on display. This input device typically has two degrees of freedom in two axes, a first axis (e.g. x) and a second axis (e.g. y), that allows the device to specify positions in a plane.

The methods described herein are related to the use of computer system for implementing FinFET circuits. According to one embodiment, the implementing FinFET circuits is provided by computer system in response to processor executing one or more sequences of one or more instructions contained in main memory. Such instructions may be read into main memory from another computer-readable medium, such as a computer-readable storage medium or a computer-readable storage device. Execution of the sequences of instructions contained in main memory causes processor to perform the process steps described herein. One or more processors in a multi-processing arrangement may also be employed to execute the sequences of instructions contained in main memory. In alternative embodiments, hard-wired circuitry may be used in place of or in combination with software instructions to implement the embodiments described herein. Thus, embodiments described herein are not limited to any specific combination of hardware circuitry and software.

The term "computer-readable medium" as used herein refers to any medium that participates in providing instructions to processor for execution. Such a medium may take many forms, including non-volatile media and volatile media. Non-volatile media includes, for example, optical or magnetic disks. Volatile media includes dynamic memory, such as main memory.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to processor for execution. For example, the instructions may initially be carried on a magnetic disk of a remote computer. The remote computer can load the instructions into its dynamic memory and send the instructions over a telephone line using a modem. A modem local to computer system can receive the data on the telephone line and use an infrared transmitter to convert the data to an infrared signal. An infrared detector coupled to bus can receive data carried in the infrared signal and place the data on bus. Bus carries the data to main memory, from which processor retrieves and executes the instructions. The instructions received by main memory may optionally be stored on storage device either before or after execution by processor.

The computer system may also include a communication interface coupled to bus. Communication interface provides a two-way data communication coupling to a network link that is connected to a local network. For example, communication interface may be an integrated services digital network (ISDN) card or a modem to provide a data communication to a corresponding type of telephone lines. As another example, communication interface may be a local area network (LAN) card to provide a data communication connection to a compatible LAN. Wireless links may also be implemented. In any such implementation, communication interface sends and receives electrical, electromagnetic or optical signals that carry digital data streams representing various types of information.

Network link typically provides data communication through one or more networks to other data services. For example, network link may provide a connection through local network to a host computer or to data equipment operated by an Internet Service Provider (ISP). ISP in turn provides data communication services through the world wide packet data communication network commonly referred to as the "Internet". Local network and Internet both use electrical, electromagnetic or optical signals that carry digital data streams. The signal through the various networks and the signals on network link and through communication interface, which carry the digital data to and from computer system, are exemplary forms of carrier waves transporting the information.

The computer system can send messages and receive data, including program code, through the network(s), network link and communication interface. In the Internet example, a server might transmit requested code for an application program through Internet, ISP, local network and communication interfaced. In accordance with the invention, one such downloaded application provides for processing captured images as described herein.

The received code may be executed by processor as it is received, and/or stored in storage device, or other non-volatile storage for later execution. In this manner, computer system may obtain application code in the form of a carrier wave.

I claim:

1. A majority gate having three inputs and an output comprising:
    a first N-FinFET having a source, a drain, a front gate, and a back gate; the drain of the first N-FinFET is connected to the output of the majority gate;
    a second N-FinFET having a source, a drain, a front gate, and a back gate, the drain of the second N-FinFET is connected to the source of the first N-FinFET;
    a third N-FinFET having a source, a drain, a front gate, and a back gate, the drain of the third N-FinFET is connected to the source of the second N-FinFET, the source of the third N-FinFET is connected to a low reference voltage
    a first P-FinFET having a source, a drain, a front gate, and a back gate; the drain of the first P-FinFET is connected to the output of the majority gate;
    a second P-FinFET having a source, a drain, a front gate, and a back gate, the drain of the second P-FinFET is connected to the source of the first P-FinFET;
    a third P-FinFET having a source, a drain, a front gate, and a back gate, the drain of the third P-FinFET is connected to the source of the second P-FinFET, the source of the third P-FinFET is connected to a high reference voltage.

2. The six-transistor majority gate of claim 1, wherein the first N-FinFET, the second N-FinFET, and the third N-FinFET have input pairs (A', B'), (A', C') and (B', C') in no particular order, where A', B', C' are complement of the primary inputs A, B, C of the majority gate.

3. The majority gate of claim 2, wherein the first P-FinFET, the second P-FinFET, and the third P-FinFET have input pairs (A', B'), (A', C') and (B', C') in no particular order.

4. A 2-1 MUX having two data inputs, a selection input, and an output, comprising:
    a first N-FinFET having a source, a drain, and two gates; the drain of the first N-FinFET is connected to the output of the majority gate;
    a second N-FinFET having a source, a drain, and two gates, the drain of the second N-FinFET is connected to the source of the first N-FinFET; the source of the second N-FinFET is coupled to a ground reference voltage.
    a first P-FinFET having a source, a drain, and two gates; the drain of the first P-FinFET is connected to the output of the majority gate;
    a second P-FinFET having a source, a drain, and two gates, the drain of the second P-FinFET is connected to the source of the first P-FinFET; the source of the second P-FinFET is coupled to a high reference voltage.

5. The 2-1 MUX of claim 4, wherein the first N-FinFET and the second N-FinFET have input pairs (S, A') and (S', B'), in no particular order, where A' and B' are complement of the data inputs A, B, wherein S is the selection input and S' is the complement of S.

6. The 2-1 MUX of claim 5, wherein the first P-FinFET and the second P-FinFET have input pairs (S, B') and (S', A'), in no particular order.

7. A method for generating any digital circuit by first writing the output expression in OR-AND form, translate the OR-AND expression into CMOS circuit, and then merge any two parallel NMOS transistors or any two parallel PMOS transistors into one N-FinFET or one P-FinFET.

8. A computer readable storage medium for generating a digital circuit comprising an output, the computer readable storage medium carrying one or more sequences of one or more instructions which, when executed by one or more processors, cause the one or more processors to perform the computer-implemented steps of:
   writing an output expression corresponding to the output of the digital circuit in OR-AND form;
   translating the OR-AND expression into digital circuit having NMOS and PMOS; and
   merging two parallel NMOS transistors into a N-FinFET; and
   merging two parallel PMOS transistors into a P-FinFET.

9. The computer readable storage medium recited in claim 8, wherein the one or more sequences of one or more instructions further cause the one or more processors to perform the computer-implemented steps of:
   replacing an unpaired NMOS transistor with a N-FinFET; and
   replacing an unpaired PMOS transistor with a P-FinFET.

\* \* \* \* \*